(12) United States Patent
Moriceau et al.

(10) Patent No.: US 9,219,004 B2
(45) Date of Patent: Dec. 22, 2015

(54) METHOD OF FABRICATING POLYMER FILM IN THE CAVITY OF A WAFER

(75) Inventors: Hubert Moriceau, Saint Egreve (FR);
Maxime Argoud, Lyons (FR);
Christophe Morales, Saint Pierre de Message (FR); Marc Zussy, Saint Egreve (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 305 days.

(21) Appl. No.: 13/819,993

(22) PCT Filed: Aug. 24, 2011

(86) PCT No.: PCT/EP2011/064587
§ 371 (c)(1),
(2), (4) Date: Apr. 10, 2013

(87) PCT Pub. No.: WO2012/028518
PCT Pub. Date: Mar. 8, 2012

(65) Prior Publication Data
US 2013/0196484 A1 Aug. 1, 2013

(30) Foreign Application Priority Data
Aug. 30, 2010 (FR) ..................... 10 56863

(51) Int. Cl.
| | |
|---|---|
| *H01L 21/00* | (2006.01) |
| *H01L 29/06* | (2006.01) |
| *H01L 21/762* | (2006.01) |
| *H01L 21/20* | (2006.01) |

(Continued)

(52) U.S. Cl.
CPC ...... *H01L 21/76251* (2013.01); *H01L 21/2007* (2013.01); *H01L 21/762* (2013.01); *H01L 21/76224* (2013.01); *H01L 21/68* (2013.01); *H01L 21/6835* (2013.01)

(58) Field of Classification Search
CPC ................... H01L 21/76251; H01L 21/76224; H01L 21/6835; H01L 21/68; H01L 21/762; H01L 21/2007
See application file for complete search history.

(56) References Cited

U.S. PATENT DOCUMENTS 5,985,681 A * 11/1999 Hamajima et al. ............... 438/8
7,344,959 B1 * 3/2008 Pogge et al. .................. 438/459
(Continued)

FOREIGN PATENT DOCUMENTS

| FR | 2895419 | 6/2007 |
|---|---|---|
| FR | 2913815 | 9/2008 |

*Primary Examiner* — Alonzo Chambliss
(74) *Attorney, Agent, or Firm* — Occhiuti & Rohlicek LLP

(57) ABSTRACT

A method for obtaining a film made out of a first material on a polymer support, said method comprising bonding a first wafer to a second wafer, thereby defining a bonding interface between said first wafer and said second wafer, at least one of said first and second wafers comprising a layer of said first material situated in proximity to said bonding interface, in said first wafer, hollowing out a cavity, said cavity comprising a bottom parallel to said bonding interface that defines, in said first wafer, a bottom zone at a controlled distance relative to said second wafer, forming, in said cavity, a polymer layer on a thickness controlled from a bottom thereof to obtain a combined wafer portion, said combined wafer portion comprising a bottom zone formed by said polymer layer on said bottom and a peripheral zone, and eliminating said second wafer on a major portion of a thickness thereof, thereby releasing, beneath said polymer layer, a film comprising said layer of said first material.

16 Claims, 5 Drawing Sheets

(51) Int. Cl.
*H01L 21/683* (2006.01)
*H01L 21/68* (2006.01)

(56) References Cited

U.S. PATENT DOCUMENTS 7,554,177 B2 * 6/2009 Geefay et al. ................ 257/622
8,828,244 B2 * 9/2014 Fournel et al. ................ 216/11
2005/0095813 A1 * 5/2005 Zhu et al. ...................... 438/459
2006/0160273 A1 * 7/2006 Chen ............................. 438/113
2007/0275300 A1 * 11/2007 Salot et al. .................... 429/163

* cited by examiner

METHOD OF FABRICATING POLYMER FILM IN THE CAVITY OF A WAFER

CROSS REFERENCE TO RELATED APPLICATION

This application is the national phase under 35 USC 371 of international application no. PCT/EP2011/064587, filed Aug. 24, 2011, which claims the benefit of the priority date of French application no. 1056863, filed Aug. 30, 2010. The contents of the aforementioned applications are incorporated herein in their entirety.

FIELD OF THE INVENTION

The invention pertains to a method for making a thin film, for example made of silicon that is advantageously monocrystalline, on a polymer support.

The main advantages brought by the use of a polymer as a support layer include:
the simplification of the surface treatment operations to be performed during bonding steps, if any,
the low cost of the material and of its steps of deposition or bonding,
strong adhesion at low temperatures,
high capacity for dismounting (i.e. detaching) by specific treatment of the polymer.

Now, it is difficult, at present, to obtain a thin film of this kind, typically less than about 10 micrometers thick, on a polymer support when trying to obtain a film that is:
monocrystalline,
fine,
homogenous in thickness, including in the lateral dimension (typically several centimeters square),
capable of being processed (i.e. capable of undergoing steps for forming components such as microelectrical (or nanoelectrical), micro-optical (or nano-optical), micromechanical (or nanomechanical) components, etc. The steps for forming are for example steps of etching or deposition.

It must be noted that there are numerous materials that cannot be deposited on a polymer support, for example for reasons of thermal constraints (it can be understood that the polymer should be capable of withstanding the deposition treatment considered whereas, depending on the materials, especially in the field of semiconductor materials, it can happen that a deposition cannot be made at temperatures below several hundreds of degrees Celsius.

PRIOR ART

Given the above, a current manner of making a film made of monocrystalline silicon on a polymer support consists in bonding a silicon substrate to polymer support and in mechanically or mechanically/chemically thinning the silicon substrate until only the desired thickness is allowed to remain. However, the film thus obtained:
does not have adequate homogeneity of thickness, especially on the big surfaces (it is not possible in practice to define a reference relative to the rear face of the polymer support),
is difficult to handle during, for example, steps for making components on this silicon film because the polymer support can be far too flexible to be capable of being grasped by an equipment grasping tool,
has very high level of flaws on the substrate edge To prevent problems related to the thinning step, another method is to bond an already made structure (i.e. generally a stack of layers, including the future film), typically of the "silicon on insulator" or SOI type, on a polymer support and withdraw the initial SOI support in using the buried oxide layer as a sacrificial layer or etching barrier layer. Thus, effectively, a film of homogenous thickness (defined by the initial homogeneity of the surface film of the SOI) is obtained but the obtained film:
has a high cost price owing to the high cost of the method thus implemented,
can be, as in the above case, difficult to handle during subsequent steps for making components since, again, the polymer support can be far too flexible to be capable of being handled by an equipment grasping tool.

PRESENTATION OF THE INVENTION

There therefore remains the need for a method that can be used to obtain a thin film of a material, such as advantageously monocrystalline silicon, on a polymer support that makes it possible to obtain high constancy of thickness even for great surface areas of film according to a configuration enabling processing steps (making of components, deposition of other layers, etc) at a moderate cost.

The invention to this end proposes a method for making a film out of a first material on a polymer support according to which,
a first wafer is bonded to a second wafer in defining a bonding interface between these wafers, at least one of these wafers comprising at least one layer of the first material situated in proximity to the interface,
there is hollowed out, in the first wafer, at least one cavity, the bottom of which, parallel to the interface between the first and second wafers, defines, in the first wafer, a bottom zone in being at a controlled distance relative to the second wafer,
a polymer layer is formed in this cavity on a thickness controlled from its bottom,
the second wafer is eliminated on at least the major portion of its thickness, so as to release, beneath the polymer layer, a film comprising said layer of the first material.

It can be understood that, after the filling of the cavity, there is a portion of wafer available that is combined, substantially plane, comprising at least one zone formed by the polymer layer on a lower zone and a peripheral zone.

Advantageously, outside the peripheral zone, the upper wafer comprises at least one zone, less hollowed out than said cavity (it can be a non-hollowed zone) and forming an islet or a wall bordered by the cavity. Here, the notion of islet or wall can be defined as representing a zone bordered by at least two distinct cavity zones, which may or may not be in communication. Another way of expressing this advantageous characteristic consists in saying that, advantageously, a cavity prepared in the first wafer comprises at least one zone that is less hollow than the rest of the cavity, or is even not hollow, forming for example an islet, a pillar or a wall coming from the first wafer, the layer of polymer bordering this islet or this wall (in the case of an islet it will be understood that said cavity zones communicate with each other, unlike in the case of a wall, where said zones belong to cavities that are in principle distinct).

Equally advantageously, at least two cavities of different depths are hollowed out.

Preferably, at least one of the wafers comprises a processed layer in proximity to the bonding interface.

Advantageously, before the elimination of the second wafer, the layer of polymer and/or the first wafer are ground. Thus, there is obtained a combined wafer portion that is substantially plane, comprising at least one zone formed by the polymer layer on the bottom zone and a peripheral zone. This grinding can indeed be done on only the upper wafer alone (before or after the hollowing out of the cavity), or on the polymer layer alone (for example if it is thicker than the depth of the cavity considered) or on both these element.

Advantageously, the elimination of the second wafer is achieved by detaching the bonding interface.

Equally advantageously, the elimination of the second wafer is done by selective etching of a sacrificial layer provided in one of the wafers in proximity to the interface.

Equally advantageously, the elimination of the second wafer is partial, being done so that, with the bottom zone, a surface layer of the second wafer is preserved.

Preferably, at a preliminary step prior to the bonding step, a buried layer is formed in this second wafer, and the partial elimination of the second wafer is obtained by separation at the level of this buried layer.

The buried zone can be obtained by implantation of at least one gas species forming a buried embrittled zone and, in this case, the separation could be obtained by application of mechanical and/or thermal stresses.

The buried zone in one variant may be constituted by a porous zone (for example porous silicon). Such a porous zone can be considered to be also a brittle zone. In this case, the separation would be obtained by the application of mechanical stresses at this buried layer.

According to another variant, the buried layer is a sacrificial layer which will be eliminated at the time of separation by an appropriate technique, for example by selective chemical etching.

Advantageously, after the step for hollowing out and before the step for filling the cavity, a strain-relief treatment is applied.

Advantageously, the polymer layer fills the cavity on only a part of its thickness.

In a preferred manner, the thickness of the film carried by the polymer support is at most 100 micrometers and its cross-section is at least equal to one centimeter. Indeed, below such a thickness, it becomes difficult to handle a silicon layer with a diameter of 200 mm without resorting to a specific support, herein constituted by the polymer layer.

Also preferably, the thickness of the bottom zone ranges from 5 micrometers to 100 micrometers. In fact, it can happen that the thickness of the film is formed only at a part of the bottom zone.

Preferably, each cavity is surrounded by a rim (with a width of at least about 10 micrometers.

Advantageously, at least one processing step is applied to the film and then the portion of combined wafer is separated from the peripheral zone.

Preferably, the first material is monocrystalline.

The first material, often of a semiconductor type, can be made especially of silicon or another element of the IVA column of the periodic table of elements or an alloy of these elements (for example SiGe), but also an alloy of elements from the IIIA-VA columns (such as AsGa or InP), or even the IIA-VIA columns. It may also be an alloy of these materials. This material can also be doped.

DESCRIPTION OF THE FIGURES

Objects, features and advantages of the invention shall appear from the following description given by way of a non-exhaustive illustratory example, with reference to the appended drawings, of which.

The figures show various embodiments of the invention, of which the first (FIGS. 1 to 6) is particularly simple, the second (FIGS. 7 to 13) corresponds to a more complex geometry of cavities, the third (FIGS. 14 to 17) corresponds to the case where the upper wafer has been processed on the lower surface before bonding to the lower wafer, the fourth embodiment (FIGS. 18 to 21) corresponds to a case of partial filling of the cavity and a partial elimination of the upper wafer and the fifth (FIGS. 22 to 25) corresponds to a case where the lower wafer is eliminated on only a part of its thickness. It is clear that certain of these variants can be combined even if this is not shown. In particular, it is possible for the upper wafer to have been processed on the lower face before bonding and for the lower wafer to be only partially eliminated.

All these embodiments lead to the formation of a thin film of material on a polymer support while at the same time giving the assembly rigidity sufficient to enable it to be handled during certain steps at least, despite the flexibility of the polymer.

The information provided here below with respect to the first embodiment can be applied, barring incompatibility, to the other embodiments.

First Embodiment

FIGS. 1 to 6 represent a mode of implementing the invention in a particularly simple case.

Figure 1:
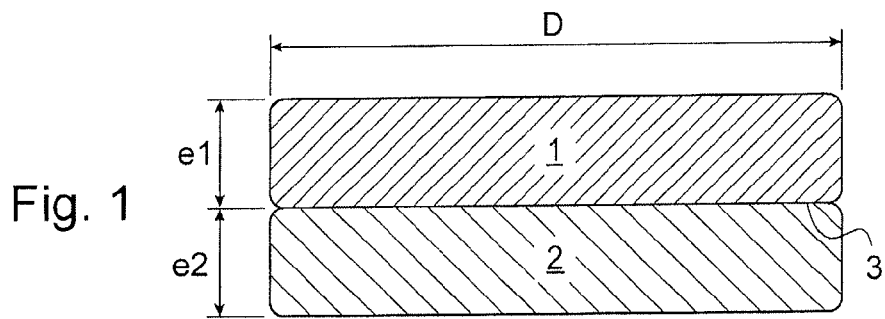
FIG. 1 is a schematic drawing of the stacking of two wafers.

FIG. 1 shows an assembly of two wafers 1 and 2 bonded to each other at an interface 3. The wafers 1 and 2 used are typically standard wafers used in micro-technology: they can have constant thicknesses (even if this is not necessary in view of the possible steps of grinding during the method of the invention) that are possibly equal.

The upper wafer 1 is designed to form a thin film on a polymer support while the lower wafer has mainly only a support role. It must be noted that the fact of stating herein that a wafer is upper or lower is intended only to facilitate the description but that the invention can also be implemented in reversing the positions of the wafers.

Since it is in the upper wafer 1 that the thin film (at least partly) and the polymer support will be defined, this wafer is constituted by at least one material of which it is sought that the thin film should be formed at least in part.

This wafer 1 comprises at least one layer of said material situated in proximity to the bonding interface, along this interface or at a small distance from it (typically smaller than 50 micrometers or even ten micrometers).

In the example considered here, the first wafer 1 is entirely constituted by said material, for example silicon. Given the practical value of obtaining the layers of monocrystalline silicon on a polymer support, the material of the wafer 1 is advantageously monocrystalline.

The wafer 2 forms a rigid support. To this effect, for example, the wafer 2 has a thickness of at least 5 μm and is made out of a material with a Young's modulus greater than 10 Gpa at 25° C.

The constitution of the second wafer 2 can be chosen arbitrarily. This wafer can be constituted by the same material as the first wafer 1 (without being necessarily monocrystalline) if it is desired that the joining of the two wafers should be truly homogenous, especially as regards thermal expansion. However, many other materials can be used, for example glass. Advantageously, if grinding steps are planned using this wafer as a reference, then a high uniformity of thickness will be chosen for this lower wafer, typically with a total thickness variation (TTV) tolerance of less than one micrometer.

The wafers are typically several tens, or even hundreds, of micrometers thick, with a cross-section that can be equal to several centimeters or even tens of centimeters. In the example considered herein, the thicknesses e1 and e2 of the wafers 1 and 2 are equal to each other with a value of 725 micrometers. As for the cross-section, which is a diameter D when the wafers are disks, it is 200 mm. It is easily understood that other shapes are possible, especially oval, rectangular, polygonal, etc. Other ranges of dimensions are of course possible.

The bonding of the two wafers may be a molecular bonding (also called direct bonding). It is advantageously made so that it can be detached (the term used is "weak" direct bonding). As a variant, it may be a bonding by adhesive or it may be fusion bonding, etc.

Figure 2:
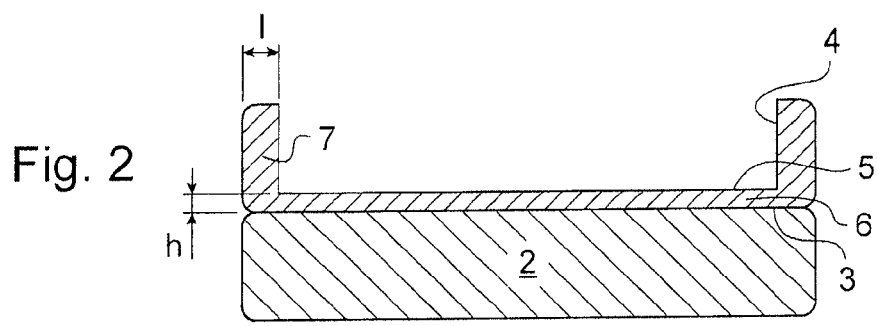
FIG. 2 is another schematic drawing of the above stacking after the hollowing out of a cavity in the upper wafer.

FIG. 2 represents a step for hollowing out a cavity 4 in the first wafer 1. The bottom 5 of this cavity defines a bottom zone 6 which is at a controlled distance from the second wafer 2, whether it is the lower surface of this wafer 2 or the bonding interface 3.

When the first wafer has the desired material only in a layer situated near the interface, the depth of the cavity is chosen so that this layer is (on at least one part of its thickness) in the bottom zone 6.

The thickness h of the bottom zone is chosen as a function of both the thickness of the desired film and the subsequent steps. It is typically a few tens of micrometers (40 micrometers in the example considered herein but other values can be planned for example 100 micrometers or 25 or even 10 or even 5 micrometers). As for the cavity, it is bordered by a peripheral zone 7 of the first wafer 1, the width l of which is typically of some millimeters or even some tens of millimeters (25 millimeters in the example considered here or even 10 millimeters). In practice, this width is chosen as a function of the other dimensions of the wafer 1 and of the depth of the cavity to constitute a rim (ring-shaped when the wafer is in the form of a disk) sufficient to provide the combined wafer obtained in FIG. 4 with rigidity sufficient for it to be handled without getting excessively deformed.

The shape of the cavity is advantageously the same as that of the wafer (for example it is circular if the wafer is itself circular), but it is easily understood that the shape of the cavity can be chosen independently of that of the wafer 1. Furthermore, the cavity is herein centered relative to the wafer, which is in no way necessary (see the example of FIGS. 7 to 13).

The cavity can be formed by any appropriate prior-art method, for example by grinding or by chemical etching (based on KOH in the example of silicon) or by dry etching, deep-plasma etching, laser ablation, ultrasound ablation, etc. This hollowing-out step comprises if necessary the formation of an etching mask according to the standard techniques known to those skilled in the art.

The TAIKO process developed by the firm DISCO is particularly suited to making a circular cavity by grinding. In this process, the structure to be hollowed out is pumped out on a porous ceramic by means of a vacuum pump in order to keep it during the grinding and ensure high homogeneity of hollowing out. To hollow out the structure, a grinding wheel is used with a diameter smaller than the radius of the structure to be hollowed out. For example, for a structure with a diameter of 200 mm, it is possible to use a TAIKO grinding wheel with a diameter of 98 mm and thus make a cavity of the order 188 to 198 mm in diameter. The grinding wheel is mounted on a spindle driven in rotation, the structure being itself also in rotation. The thickness of the hollowing is checked by checking the descent of the spindle by means of a wormscrew device.

This method makes it possible, as needed, to obtain cavities of different diameters as a function of the diameter of the grinding wheel used. It also makes it possible, by shifting the center of the grinding wheel relative to that of the structure in rotation, to obtain ring-shaped cavities (cf. FIGS. 7 to 13).

This hollowing-out step can be accompanied by a processing operation, for example in a tetramethyl-ammonium hydroxide (TMAH) bath at 70° for one hour in the case of silicon, aimed at reducing possible damage and internal strains within the first wafer owing to the hollowing out of the cavity.

Various steps of the method (not shown) can then be performed when they require access to the bottom zone 6 from the bottom of the cavity (etching, ion implantation, thermal processing, deposition, etc). These steps can be made on all or part of the bottom of the cavity.

Figure 3:
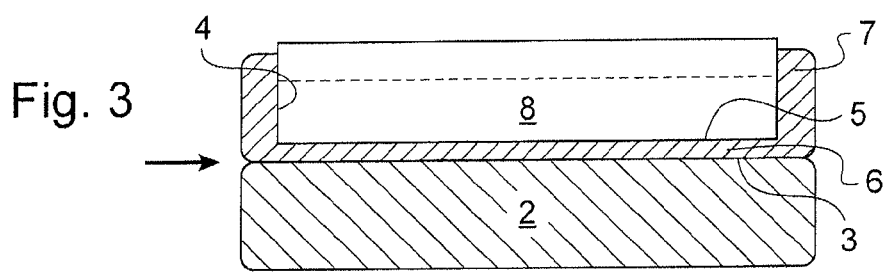
FIG. 3 is another schematic drawing of the above stacking after the filling of the cavity with a polymer material above the level of the upper wafer (in dashes, a variant has been shown where the level of filling of polymer material is such that it does not totally fill the cavity)

FIG. 3 shows a subsequent step for at least partly filling the cavity with a polymer 8, the material of which is that of the polymer support on which it is sought to obtain a thin film. It can be noted that the mass 8 can overflow from the cavity (the example of FIGS. 8 to 21 will show that, on the contrary, it is also possible for this mass not to occupy the entire volume of the cavity, as illustrated also by the dashes in FIG. 3). In the event of overflow or recess, a grinding step could possibly be planned, as illustrated in FIG. 4, to bring the surface of the polymer to the level of the non-hollowed peripheral zone of the wafer 1.

Such a grinding step is however only optional in as much as, in particular, the conditions for shaping the polymer layer can be sufficient to ensure sufficient control of the thickness of this layer, especially its constancy.

Depending on the nature of the polymer considered, this filling step comprises a sub-step of drying or reticulation. Advantageously, this polymer is a thermosetting resin (possibly at ambient temperature), but other types of polymers or even materials are possible. They are for example PDMS (polydimethyl siloxane, i.e. a siliconized polymer).

Figure 4:
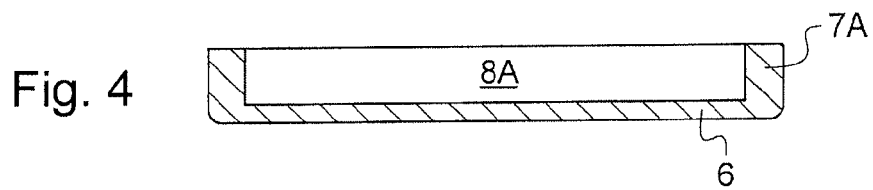
FIG. 4 is another schematic drawing of the above stacking after a grinding (optional) of the polymer layer and/or the peripheral part, not hollowed out, of the upper wafer and elimination of the lower wafer.

FIG. 4 shows the result of the optional step (see above) for grinding during which the thickness of the first wafer is equalized. To this end, it is possible to take the lower face of the second wafer 2 as a reference. In particular, when the polymer is recessed relative to the cavity (see the example of FIGS. 18 to 21), this step is not necessary since, especially, the non-hollowed peripheral zone of the wafer 1 can suffice to provide for grasping by standard grasping means. This FIG. 4 furthermore represents the result of a step for eliminating this second wafer.

This grinding by any appropriate known means can take the form of a reduction of thickness both of the mass of polymer 8 (after grinding it is designated by the reference 8A) and of the rim 7 (after grinding it is designated by the reference 7A) as a function of the thickness desired for the polymer support of the future film.

As for the elimination of the second wafer, this can be done by the etching of the totality of this second wafer. However, advantageously, the bonding between the two wafers has been done in reversible form, i.e. the bonding has been made so as to be detachable. The detaching can be done by insertion, at the bonding interface, of a wedge-like tool or a wire or a jet of pressurized fluid (this is shown schematically by an arrow to the left of FIG. 3). In such a case, the second wafer can be re-used in a new cycle for implementing the invention. This advantage can be found again if the second wafer is eliminated by separation at the level of a buried layer provided for this purpose (a layer that is embrittled for example by implantation or porosity or a sacrificial layer) described in greater detail here below.

It can be understood that the structure of FIG. 4 has a film (the bottom zone 6) fixedly joined to a polymer support 8A. Through the peripheral rim 7A, this first wafer, which has become combined (formed by both the materials of the initial wafer 1 and polymer) can have a rigidity sufficient so that it can be handled and/or undergo technological steps without getting excessively bent. This advantage is preserved when there is no grinding.

If need be, this structure of FIG. 4 can be subjected to a step of adaptation of thickness, for example by reducing the thickness of the bottom zone by dry or wet chemical etching in particular.

This structure of FIG. 4 lends itself to various steps of processing (deposition or bonding of layers and/or shaping of all or part of the components of a sensor type or the like) of the surface bared during the elimination of the second wafer. Naturally, the steps thus performed have to be compatible with the presence of the polymer (if not it can be planned to carry out certain steps implying excessively high temperatures for the polymer at a step prior to the bonding—see FIGS. 14 to 17).

Figure 5:
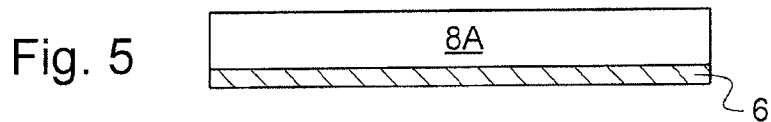
FIG. 5 is another drawing of the above stacking after elimination of the peripheral part, not hollowed out, of the upper wafer.

FIG. 5 represents a subsequent step, advantageously performed after all the steps for processing the film have been performed, namely a step for cutting out the rim, which gives a thin film on a polymer support (it is sufficient to invert FIG. 5).

Inasmuch as the manufacture of the structure of FIG. 4 can be achieved at a first place, before it is subjected to various processing operations at a second place, possibly in a firm other than the one that has performed the first steps, a substantial amount of time can pass between the steps of FIGS. 1 to 4 and that of FIG. 5.

Figure 13:
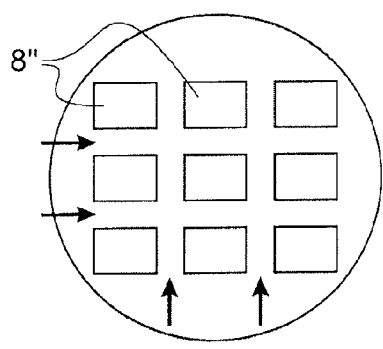
FIG. 13 is a top view of another wafer comprising a network of rectangular cavities.

As a variant, this cutting-out step can be replaced or complemented by local steps for separating portions of the film on polymer, according to requirements (see also FIG. 13).

Figure 6:
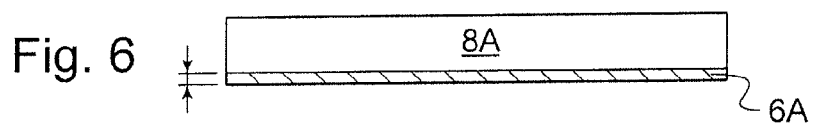
FIG. 6 is another drawing of the above stacking after reduction (optional) of the thickness of the bottom zone.

FIG. 6 represents an optional step for applying a new treatment for adapting the thickness (schematically represented by a double vertical arrow) of the film carried by the polymer support (after this reduction, this thin film is denoted as 6A). This additional reduction of thickness can for example be made in a TMAH bath at 80° for one hour (corresponding to a recessing of the order of 15 to 20 micrometers of silicon—in the event of a silica wafer, this recessing can be done by an HF etching). However, other techniques can be used, especially dry-plasma etching, chemical etching (KOH for silicon), ion etching, a chemical etching assisted by centrifugation (spin etching), chemical-mechanical polishing (CMP), dry polishing, etc. This step which is optional can, in one variant, be carried out completely as soon as the surface 6 is made free, especially before the cutting-out step illustrated in FIG. 5.

Second Embodiment

FIGS. 7 to 13 represent a variant of the first embodiment with a more complex cavity geometry. Those elements of these figures that correspond to those of FIGS. 1 to 6 are designated by same reference signs as in FIGS. 1 to 6 but with a "prime" index.

Figure 7:
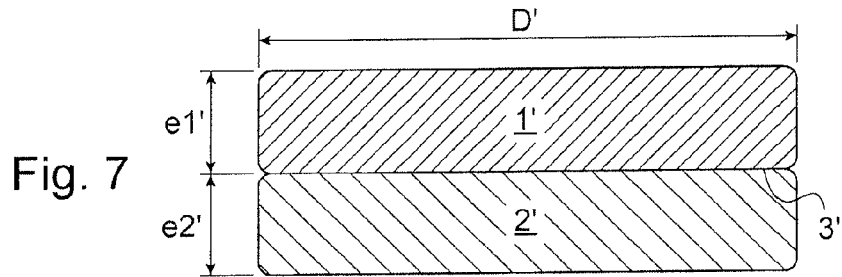
FIG. 7 is a drawing of another stacking of two wafers, similar to that of FIG. 1.

Thus, FIG. 7 shows the assembling of two wafers 1' and 2', the upper wafer of which is for example made of silicon (for example monocrystalline silicon).

Figure 8:
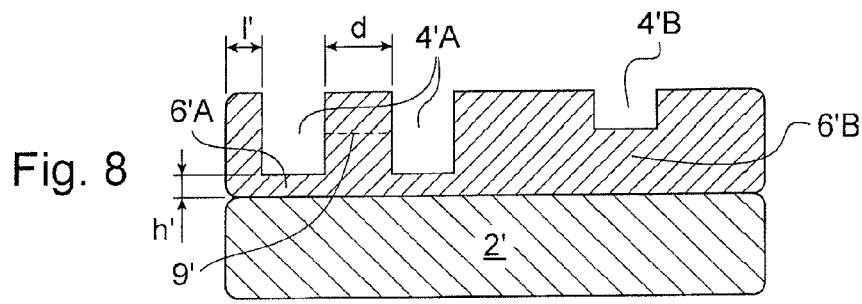
FIG. 8 is a drawing of the stacking of FIG. 7 after a hollowing out of two cavities, one of which is ring-shaped.
Figure 9:
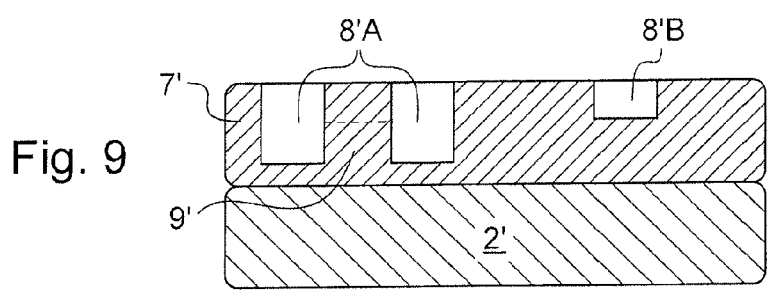
FIG. 9 is a drawing of the stacking of FIG. 7 after a filling of these cavities with a polymer material.
Figure 10:
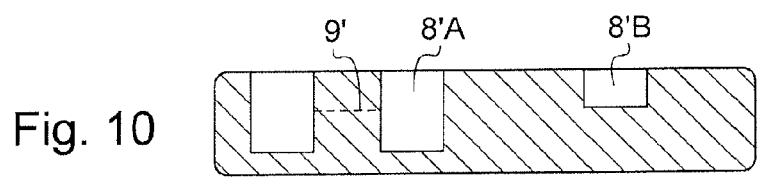
FIG. 10 is another drawing of the stacking of FIG. 7 after elimination of the lower wafer.

FIG. 8 shows a hollowing-out step which differs from that of FIG. 2 in that there are several cavities in the case represented. There are two cavities, including one cavity 4'A to the left and one cavity 4'B to the right (see also FIG. 12).

The cavity 4'A, unlike the cavity 4 of FIG. 2, has a ring shape disposed around an islet or pillar 9' forming one piece with the original wafer. For example, this cavity and this islet have circular outlines and the islet is in a median position of the cavity. It can be understood however that the shapes of the cavity and the islet (and their positions) can be chosen independently of one another (they may be polygonal, rectangular, square, oval, etc).

The width (or diameter) d of the islet is herein of the order of the width of the ring constituted by the cavity 4'A. As a variant, this islet can have a width that is far smaller, for example smaller than 10% or even 1% of the maximum cross-section of the cavity 4'A.

The islets may serve as anchoring spots in the future mass of polymer. Thus, as a variant that is not shown, it is possible to distribute, more or less evenly, within a central hollowed-out zone occupying the almost entire surface of the wafer 1, pillars of rigid material (the material of the upper wafer). These pillars make it possible to obtain high "vertical" rigidity of the polymer while leaving a certain flexibility of the polymer in its plane. They can thus serve as supports during subsequent steps (in possibly minimizing the compressive stresses on the mass of polymer).

The height of the islets may be smaller than the depth of the adjacent cavities (this is shown for example by dashes in FIGS. 8 to 11).

The cavity 4'B of any outline is herein massive (like the cavity of FIG. 2), but its depth is different from that of the first cavity 4'A.

Advantageously, around all the cavities, there remains a border whose width is at least equal at every point to a value 1' for example of the same value as 1 in FIG. 2.

Various steps of the method (as already described) can be carried out at this stage on all or part of the bottom of certain cavities, starting from the inside of the cavities.

FIG. 8 represents the result obtained after filling and grinding (optional) of the upper surface of the first wafer 1' and/or the polymer. The mass of polymer filling the cavity 4'A is designated under the reference 8'A and the mass of polymer filling the cavity 4'B is designated under the reference 8'B.

It can be understood that, after elimination of the second wafer 2' (see FIG. 10), the combined wafer obtained can be analyzed as being formed by several portions comprising films (i.e. the bottom zones of each cavity) fixedly joined to the polymer supports (i.e. the various polymer masses). It is recalled here that, for reasons of readability of the drawings, the widths represented in the figures are far smaller than in reality as compared with the thicknesses.

In practice, in the case of a plurality or cavities, the intermediate rims or walls (between adjacent cavities) are advantageously minimized with respect to their cross-sections. These walls can advantageously be used subsequently as cutting-out paths to separate the cavities from one another. In this case, they are sized and disposed to assist this cutting-out process (by means of a saw or a laser). Cutting-out lines are represented schematically by arrows in FIG. 13.

Figure 11:
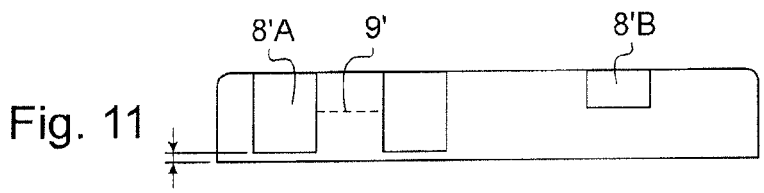
FIG. 11 is another drawing of the stacking of FIG. 7 after a reduction of the thickness of the bottom zone.
Figure 12:
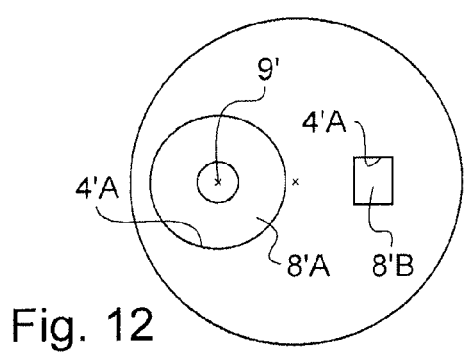
FIG. 12 is a top view of the stacking of FIG. 7.

As in the first example of an embodiment, there may be a thickness adapting processing operation after detachment of the second wafer (see FIG. 11).

Thus, as can be seen in FIG. 13, the number of cavities and therefore of masses of polymer can be far greater than two. In the example shown in this figure, there is a network of cavities of same shapes following alignments facilitating the cutting-out operations mentioned here above to detach combined zones denoted as 8".

As a variant, variations in thickness of the bottom zone can be obtained by carrying out local etching operations at the bottom of the cavity 4 of FIG. 2. Similarly, according to another variant (possibly capable of being combined with the previous one), it is possible to plan for a plurality of islets (or pillars) of any unspecified height within the cavity of FIG. 2.

Third Embodiment

FIGS. 14 to 17 represent a variant of the first embodiment in which the first wafer has been processed at its lower surface, i.e. it has already undergone one (or more) processing operations aimed especially for example at forming components or layers or so as to have an SOI type structure (with a surface layer, for example a monocrystalline layer separated from the rest of the wafer by a layer of insulator) or so as to have a surface layer separated from the rest of the wafer by a metal layer. The elements similar to those of FIGS. 1 to 6 are designated by reference signs derived from the signs of these FIGS. 1 to 6 by the addition of the number 20.

Figure 14:
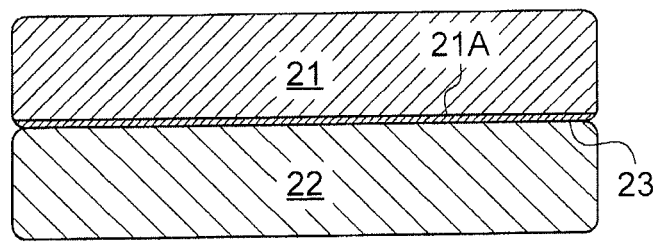
FIG. 14 is a drawing of yet another stacking of two wafers, the upper wafer of which comprises a processed layer close to the interface.

Thus, FIG. 14 represents an assembly of two wafers 21 and 22 bonded to each other so as to form an interface 23.

Unlike in the case of FIG. 1, the upper wafer 21 has been subjected, before the bonding step, to at least one processing operation (see above). This processed zone is represented schematically by a line 21A. This processed zone has a layer of useful material, for example monocrystalline silicon, situated for example between the line designated by the sign 21A and the interface.

Figure 15:
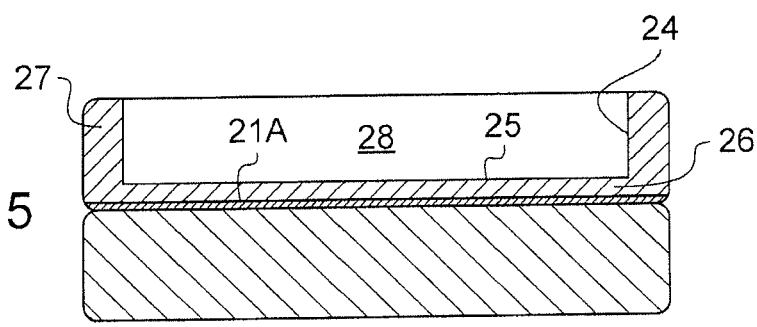
FIG. 15 is a drawing of the stacking of FIG. 14 after hollowing out of a cavity and filling of this cavity.
Figure 16:
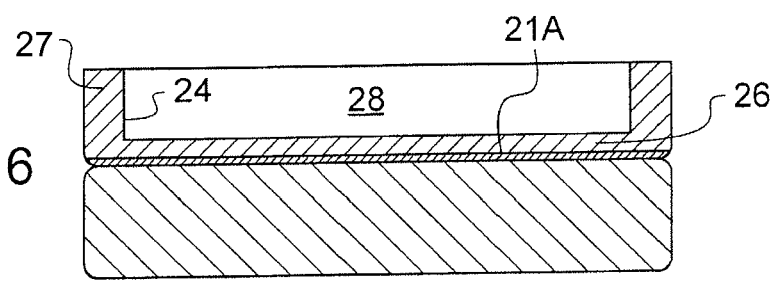
FIG. 16 is a drawing of the stacking of FIG. 14 after optional grinding of the upper surface (i.e. of the layer of polymer and/or of the peripheral part, not hollowed out) of the upper wafer.
Figure 17:
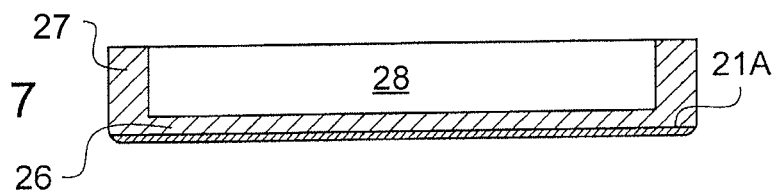
FIG. 17 is a drawing of the stacking of FIG. 14 after elimination of the lower wafer.

As in the first embodiment, a cavity 24 is hollowed out in the upper wafer, the bottom 25 of which defines a bottom zone 26. This bottom zone contains the processed zone. As above, this zone can at this stage be processed from the bottom of the cavity and there may be any unspecified number of cavities. This cavity is then filled with a polymer mass 28 (FIG. 15).

By grinding if necessary (FIG. 16), the heights of the rims 27 and of the central combined portion (formed by the polymer mass and the bottom zone) are equalized.

After elimination of the lower wafer 22 (FIG. 17), for example by detaching the bonding interface, a structure is obtained comprising a thin film (formed by the bottom zone, including the processed zone 21A) fixedly joined to a polymer support, the entire assembly being rigidified by a rim 27.

Fourth Embodiment

FIGS. 18 to 21 represent a variant of FIGS. 1 to 6, in which, firstly there is a partial filling of the cavity and secondly the elimination of the lower wafer is not done by detaching. The elements similar to those of FIGS. 1 to 6 are designated by reference signs derived from the signs of these FIGS. 1 to 6 by the addition of the number 40.

Figure 18:
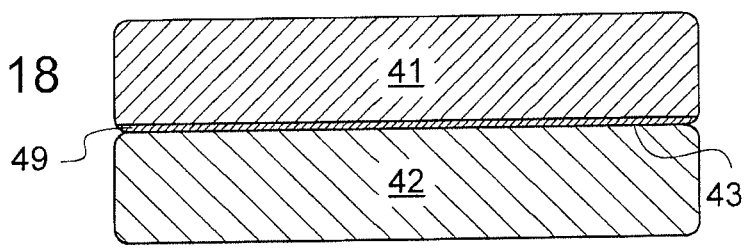
FIG. 18 is a drawing of yet another stacking of two wafers, of which the upper wafer comprises, along the interface, a sacrificial layer.

More specifically, FIG. 18 represents an assembling of two wafers 41 and 42 bonded to each other at an interface 43.

The first wafer 41 has on its surface (hence along its lower face) a sacrificial layer 49, i.e. a layer capable of being eliminated selectively relative to at least one adjacent layer of the wafer 41. For example, if the rest of the wafer is made of silicon, for example monocrystalline silicon (including the adjacent layer when it is of a nature different from that of the rest of the wafer), the sacrificial layer may be made of silicon oxide.

This layer 41 may have other functions, especially that of a stiffener or of a protective layer. This layer may have a thickness of several micrometers.

This layer 49 is represented in the form of a single layer. It will be understood however that it can be formed by several superimposed layers.

In particular, by way of an example, instead of being a direct bonding, the bonding between the sacrificial layer and the lower wafer 42 may involve a bonding layer. This layer may be considered to form part of the sacrificial layer when, in the selective elimination step, this bonding layer can be eliminated also relative to the rest of the first wafer 41.

Figure 19:
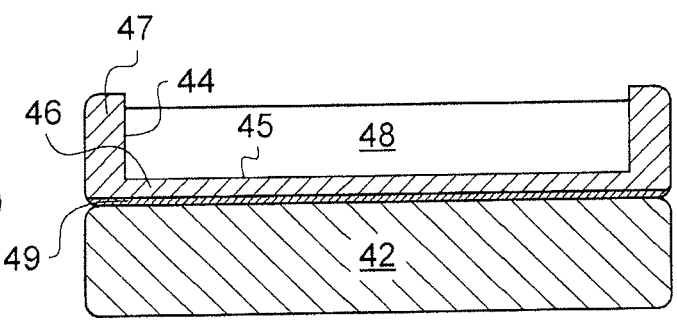
FIG. 19 is another drawing of the stacking of FIG. 18 after a hollowing out of a cavity and a partial filling of this cavity.
Figure 20:
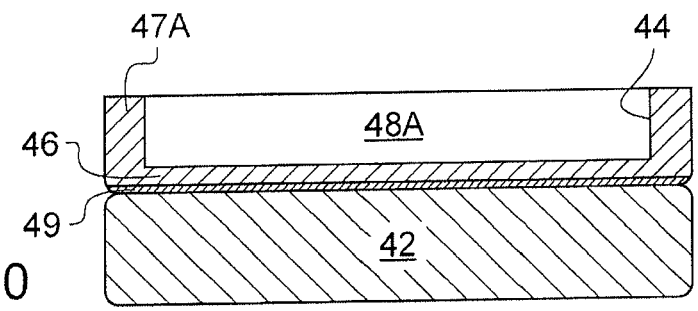
FIG. 20 is another drawing of the stacking of FIG. 18 after grinding.
Figure 21:
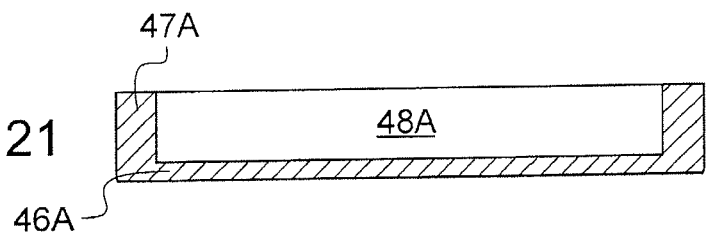
FIG. 21 is another drawing of the stacking of FIG. 18 after elimination of the lower wafer and of the sacrificial layer.

In this upper wafer 41, a cavity 44 is hollowed out (FIG. 19). This cavity is bordered by a rim 47, and its bottom 45 demarcates a bottom zone 46 including the sacrificial layer. As will be seen here below, the thickness of material between the bottom 45 and the sacrificial layer determines the thickness of the future film which will be carried by a polymer support. As explained here above, the bottom of the cavity can at this stage undergo technological steps starting from the interior of this cavity.

In this cavity 44, a polymer mass 48 is deposited. In this example, this polymer mass occupies the cavity only on a part of its thickness.

The thickness of this mass 48 however is at least equal to the thickness of the future polymer support. An (optional) step of grinding (FIG. 18) can be planned to bring the rim 47 of the wafer (identified as 47A after grinding) to the level of the mass 48 (identified as 48A after grinding). Advantageously, a thick rim will be preserved for the time needed to handle the unit by means of this rim using classic grasping tools, especially for performing technological steps.

Unlike in the first embodiment, the elimination of the second wafer is done by selective elimination of the sacrificial layer 49 (FIG. 19) of the first wafer. In principle, this elimination frees the upper surface of the second wafer which can therefore be re-used for a new cycle for implementing the invention.

The sacrificial layer 49 can for example be a silicon oxide which can be selectively etched relative to the silicon. It may also be a film of amorphous silicon deposited by PECVD. A deposit of this kind is known to contain a great deal of hydrogen. A thermal treatment at low temperature (typically 400° C.) makes it possible to induce a high density of blisters or bonding defects at the bonding interface. After the cavity has been filled with the polymer, the structure can thus be easily separated at this interface.

Thus, as in FIG. 4, there is obtained a film (residue of the bottom zone after elimination of the sacrificial layer denoted as 46A) fixedly joined to a polymer support, the entire unit being rigidified by a peripheral rim.

Fifth Embodiment

FIGS. 22 to 25 represent another variant of the first embodiment in which the elimination of the second wafer is only partial. The elements similar to those of FIGS. 1 to 6 are then designated by reference signs which are derived from the signs of these FIGS. 1 to 6 by addition of the number 60.

Figure 22:
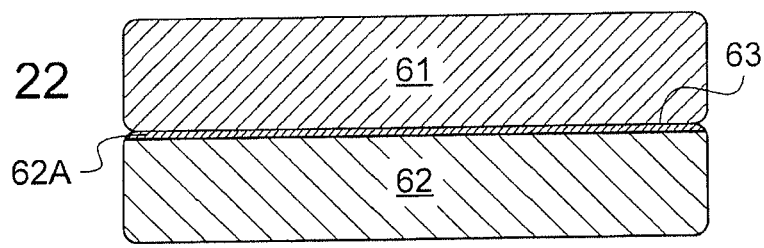
FIG. 22 is a schematic drawing of yet another stacking of two layers, the upper wafer of which comprises a processed layer.
Figure 23:
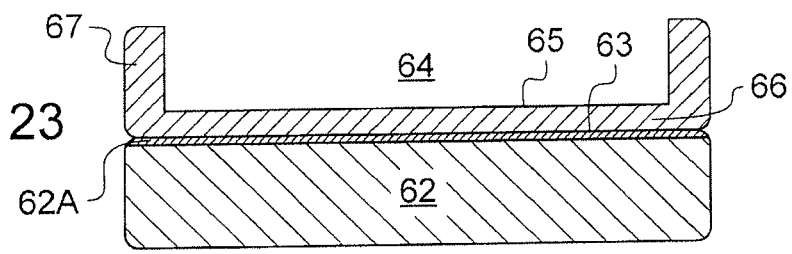
FIG. 23 is another drawing of the stacking of FIG. 22 after hollowing out of a cavity in the upper layer.
Figure 24:
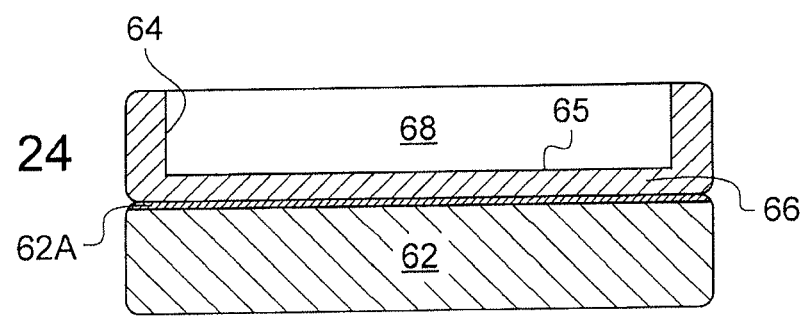
FIG. 24 is another drawing another drawing of the stacking of FIG. 22 after a filling and grinding of the upper surface of the upper wafer.

FIG. 22 thus represents a joining of two wafers 61 and 62 bonded to each other, for example by direct bonding.

Unlike in the first embodiment, the second wafer 62 has a useful layer on the upper part, namely a layer designed to form part (at least partially on its face) of the future film which is to be made fixedly joined to a polymer support. This useful layer is designated as 62A.

In the first wafer, a cavity 64 is made (FIG. 3), the bottom 65 of which demarcates a bottom zone 66 with the interface 63. This cavity is surrounded by a rim 67. The bottom can be processed if necessary as indicated in the previous example.

This cavity is filled (FIG. 24) with a polymer mass 68. This step is followed, if desired, by a grinding step (not shown here).

Figure 25:
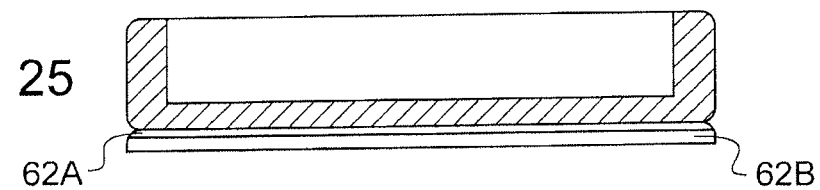
FIG. 25 is another drawing another drawing of the stacking of FIG. 22 after elimination of the lower wafer on only one part of its thickness.

FIG. 25 gives a schematic view of the result of a partial elimination of the second wafer. The useful layer 62A and possibly an underlying layer 62B remain fixed to the first wafer.

The reduction of the second wafer 62 to the set of layers 62A and 62B is obtained by any appropriate known technique.

For example, this set of layers 62A and 62B is advantageously demarcated between the upper surface of the second wafer and a buried brittle layer (obtained for example by implementation of at least one species, hydrogen, helium or the like, which generates faults embrittling the second wafer at a controlled level beneath the free surface of this first wafer). This buried brittle layer, when it exists, is done preliminarily to the step for bonding the two wafers. By the application of a low-temperature thermal treatment (i.e. compatible with the presence of the polymer mass) or, preferably by the application of mechanical stresses (in addition to or instead of a thermal treatment of this kind), separation is prompted between the layers 62A+62B and the rest of the second wafer. It must be understood that the notion of mechanical stresses must be understood in a broad sense covering the application of tensile, shearing and torsional forces as well as the localized application of a jet of fluid, or ultrasound, etc.

As a variant, the elimination of the second layer beneath the layer 62A (and the sub-layer 62B when desired) can also be obtained by mechanical milling, chemical etching (possibly up to a barrier layer planned on the lower face of the layer 62A or 62B). An example of a structure integrating such a barrier layer is SOI, the buried oxide serving as a barrier layer. In such an SOI structure, the surface film of silicon can advantageously have undergone, preliminarily to the bonding, several technological steps (for example for making CMO components). The second wafer can as a variant be formed by a stack of layers and the separation can be prompted at an interface between layers of this constituent stacking of the second wafer.

It can be noted that in FIG. 25 the structure obtained comprises a film (formed by the superimposition of the bottom zone coming from the first wafer and at least the useful layer 62A), for which it is easy to plan that at least one part will be made out of a desired material in this film (either from the first wafer or from the second wafer).

It can be easily understood that while the above embodiments have been given by mentioning silicon as an example, other materials can be implemented through the invention, especially semiconductor materials. These may be especially materials formed by other chemical elements of the IVA column of the periodic table of elements or an alloy of these elements (for example SiGe), but also an alloy of elements from the IIIA-VA columns (as well as AsGa or InP), or even from the IIA-VIA columns (such as Cd Te for example).

A particular value of the invention consists in enabling the layer carried by a polymer support to comprise a film of monocrystalline material. However, it can be understood that the implementation of the invention is not limited to this monocrystalline aspect.

The invention claimed is:

1. A method for obtaining a film made out of a first material on a polymer support, said method comprising bonding a first wafer to a second wafer, thereby defining a bonding interface between said first wafer and said second wafer, at least one of said first and second wafers comprising a layer of said first material situated in proximity to said bonding interface, in said first wafer, hollowing out a cavity, said cavity comprising a bottom parallel to said bonding interface, filling said cavity with a polymer layer having a thickness from said bottom thereof to obtain a combined wafer portion, said combined wafer portion comprising said polymer layer on said bottom and a peripheral zone, and eliminating said second wafer thereby exposing beneath said polymer layer, a film comprising said layer of said first material.

2. The method of claim 1, wherein said first wafer comprises a zone, said zone being less hollowed out than said cavity and forming one of an islet and a wall bordered by said polymer layer.

3. The method of claim 1, further comprising hollowing out a second cavity, said first cavity and said second cavity having different depths.

4. The method of claim 1, wherein at least one of said first and second wafers comprises a processed layer in immediate proximity to said bonding interface, said processed layer being a layer having undergone steps for formation of an electrical, optical or mechanical micro-component or nano-component.

5. The method of claim 1, further comprising, before eliminating said second wafer, grinding at least one of said polymer layer and said first wafer.

6. The method of claim 1, wherein eliminating said second wafer comprises detaching at said bonding interface.

7. The method of claim 1, wherein eliminating said second wafer comprises selectively etching a sacrificial layer provided in one of said wafers in proximity to said bonding interface.

8. The method of claim 1, wherein eliminating said second wafer comprises partial elimination of said wafer, thereby preserving a surface layer of said second wafer on one side of said bonding interface, the thickness of said surface layer being lesser than half the thickness of the second wafer before eliminating it.

9. The method of claim 8, further comprising forming a buried layer in said second wafer prior to bonding said first and second wafers, and wherein partial elimination of said second wafer comprises applying mechanical stresses at a level of said buried layer.

10. The method of claim 1, wherein, after hollowing out said first cavity and before filling the cavity, applying a strain-relief treatment.

11. The method of claim 1, wherein said polymer layer fills said cavity on only a part of said thickness.

12. The method of claim 1, wherein a thickness of said film carries the polymer support is at most 100 micrometers, and a cross-section has a dimension that is at least equal to one centimeter.

13. The method of claim 1, wherein a thickness of the first wafer between said bottom and said bonding interface ranges from 5 micrometers to 100 micrometers.

14. The method of claim 1, wherein each cavity is surrounded by a rim with a width of at least 10 micrometers.

15. The method of claim 1, further comprising applying at least one processing step to said film, and separating a portion of said combined wafer from said peripheral zone.

16. The method of claim 1, wherein said first material is monocrystalline.

* * * * *